United States Patent
Yagishita

Patent Number: 5,872,383
Date of Patent: Feb. 16, 1999

[54] SEMICONDUCTOR DEVICE AND METHOD OF MANUFACTURING THE SAME

[75] Inventor: Atsushi Yagishita, Yokohama, Japan

[73] Assignee: Kabushiki Kaisha Toshiba, Kawasaki, Japan

[21] Appl. No.: 880,695

[22] Filed: Jun. 23, 1997

[30] Foreign Application Priority Data

Jun. 24, 1996 [JP] Japan .................................. 8-163455

[51] Int. Cl.$^6$ .................................................. H01L 29/04
[52] U.S. Cl. .......................... 257/407; 257/367; 257/488; 257/489; 257/490; 257/496; 257/750; 438/257; 438/283; 438/454
[58] Field of Search ..................................... 257/488, 489, 257/490, 496, 367, 409, 750; 435/257, 283, 454

[56] References Cited

U.S. PATENT DOCUMENTS 5,648,673  7/1997  Yasuda ..................... 257/409

OTHER PUBLICATIONS

T. Iwamatsu, et al., "CAD–Compatible High–Speed CMOS/SIMOX Gate Array Using Field–Shield Isolation", IEEE Transactions on Electron Devices, vol. 42, No. 11, Nov. 1995, pp. 1934–1939.

Primary Examiner—Edward Wojciechowicz
Attorney, Agent, or Firm—Oblon, Spivak, McClelland, Maier & Neustadt, P.C.

[57] ABSTRACT

Disclosed is a semiconductor device, comprising a substrate having a first region and a second region surrounding the first region, a MOS transistor formed in the first region, a first conductive layer formed in the first region and constituting the lower layer of a two-layered gate electrode of the MOS transistor, a second conductive layer for isolation, the second conductive layer being formed in the second region and having an upper surface whose level is lower than that of the upper surface of the first conductive layer, a first insulating layer formed between the first and second regions, a second insulating layer formed on the second conductive layer, and a third conductive layer formed over the first conductive layer and the second insulating layer and constituting the upper layer of the two-layered gate electrode of the MOS transistor.

18 Claims, 14 Drawing Sheets

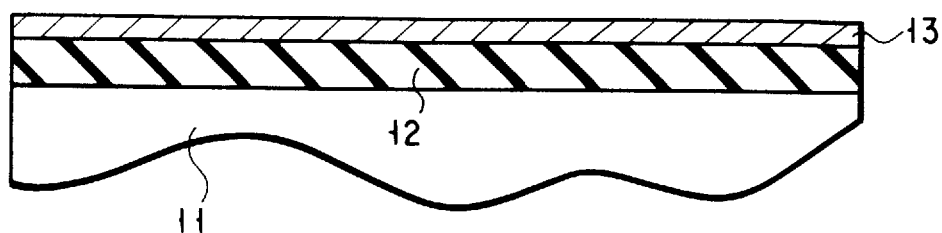
F I G. 3A
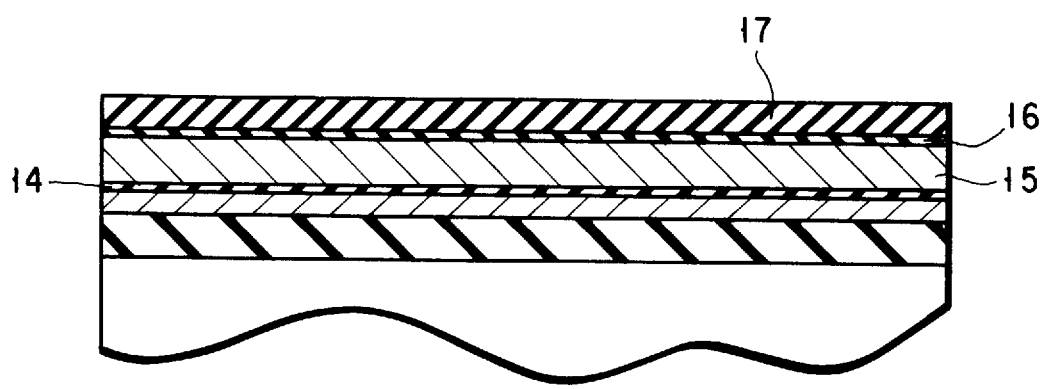
F I G. 3B
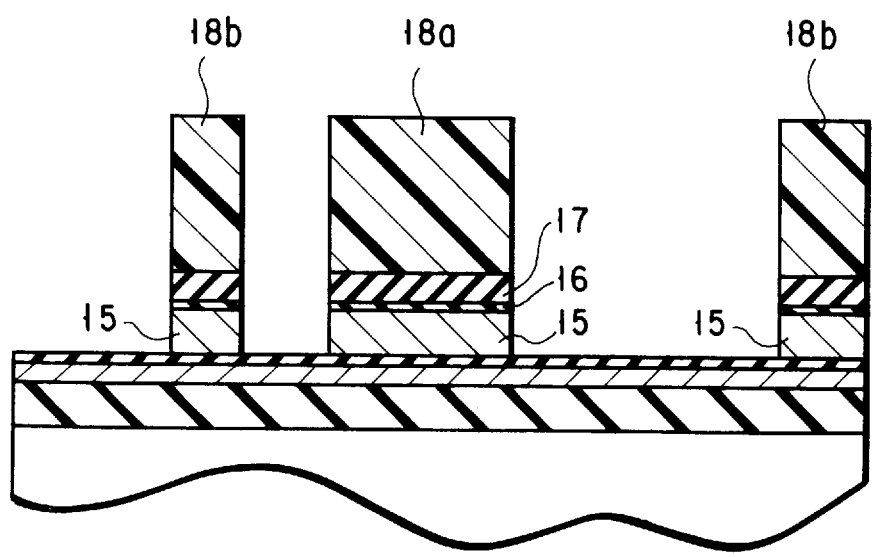
F I G. 3C

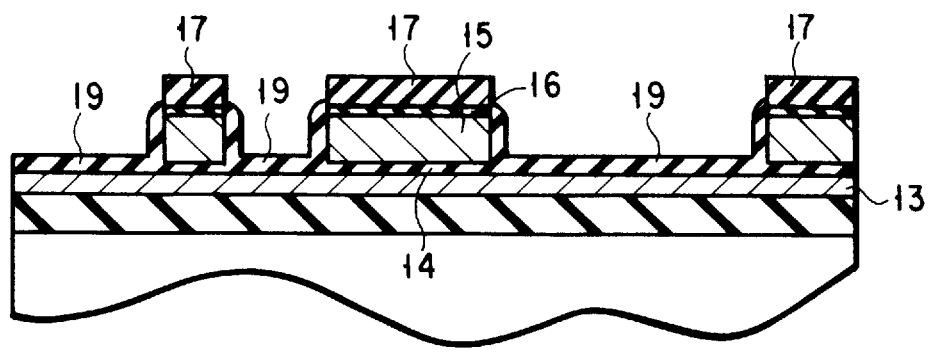
F I G. 3D
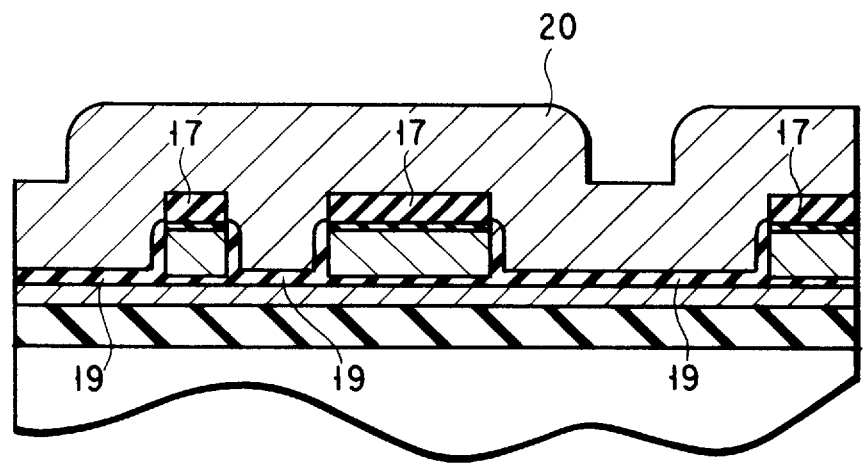
F I G. 3E
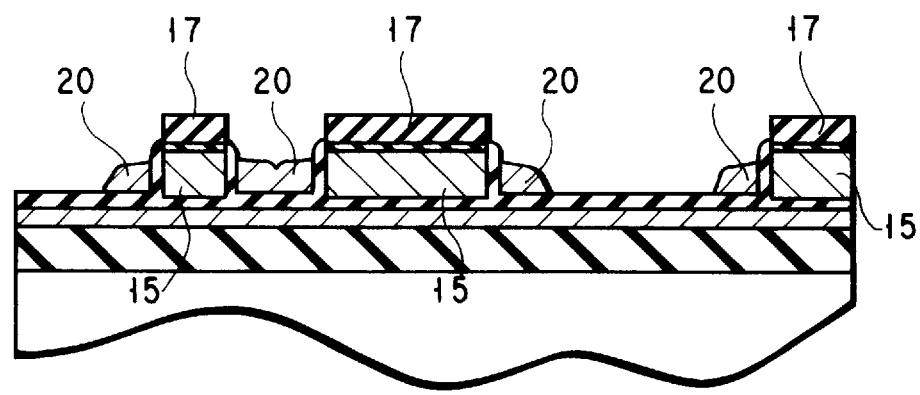
F I G. 3F

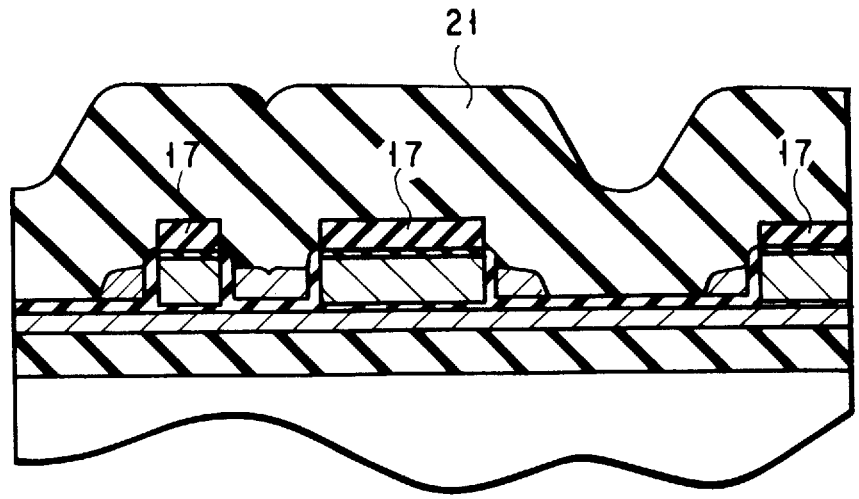
F I G. 3G
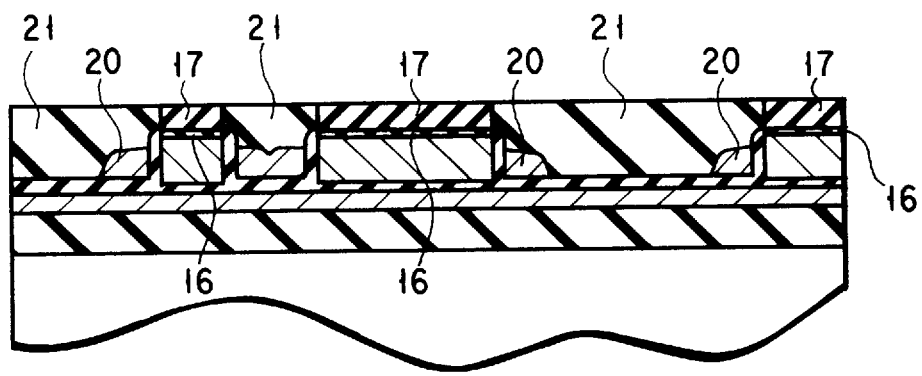
F I G. 3H
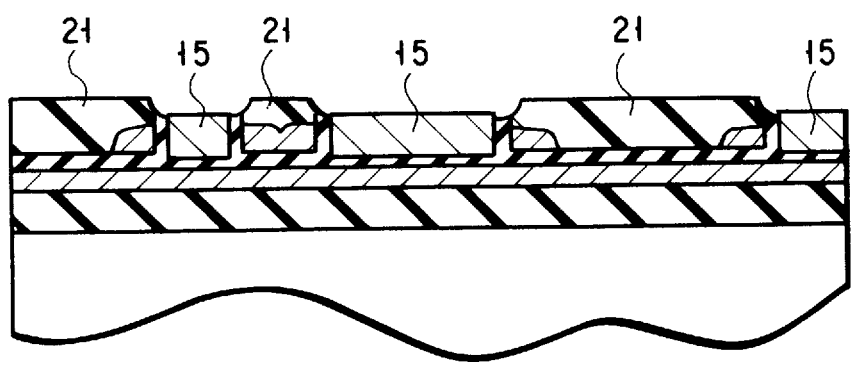
F I G. 3I

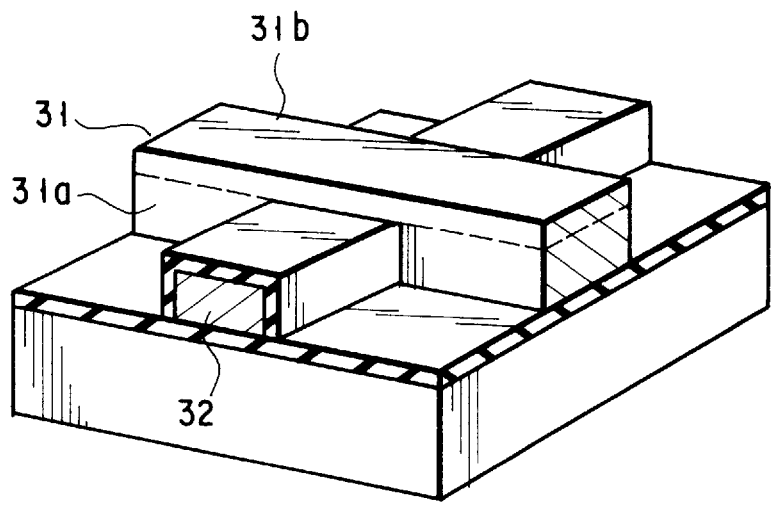
F I G. 4A

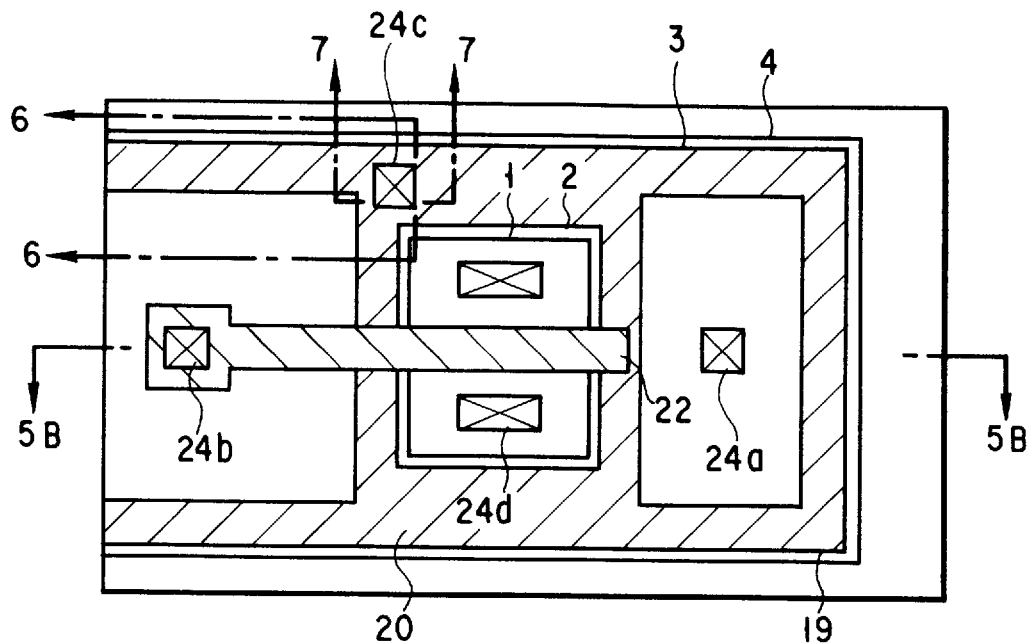
F I G. 5A
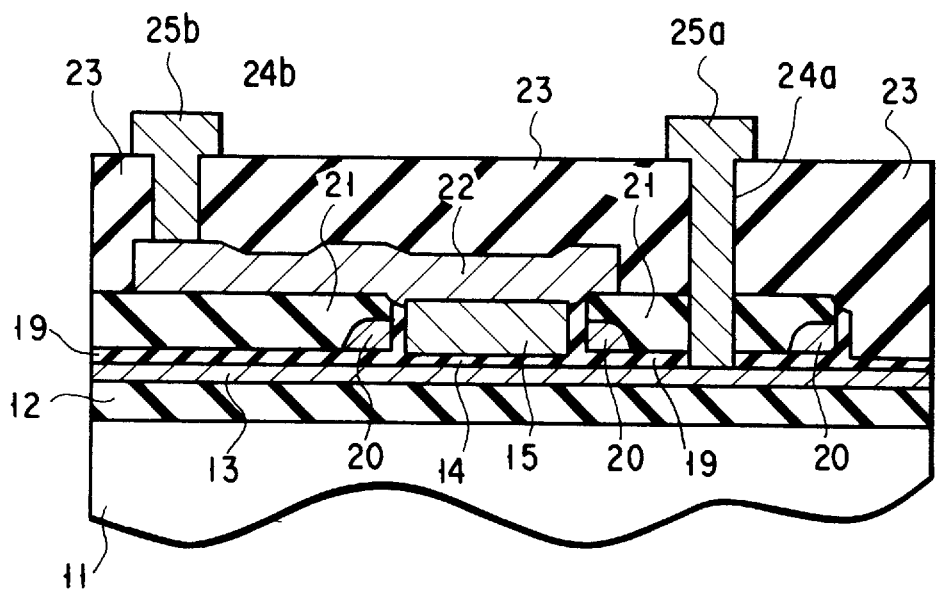
F I G. 5B

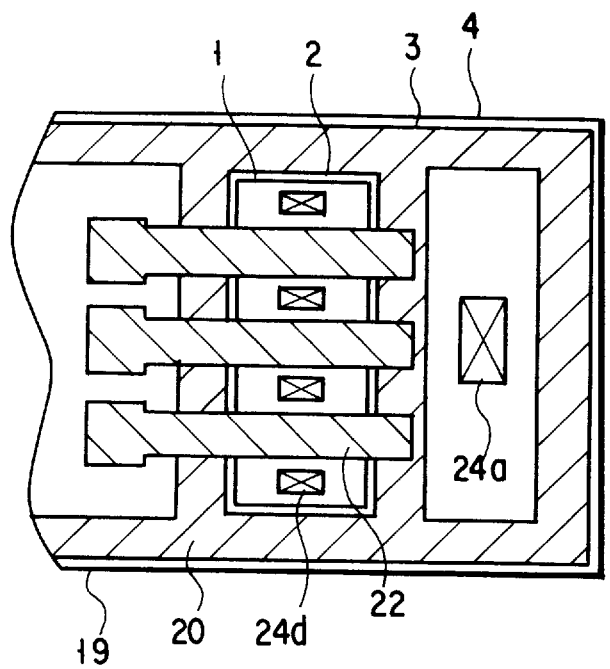
F I G. 8
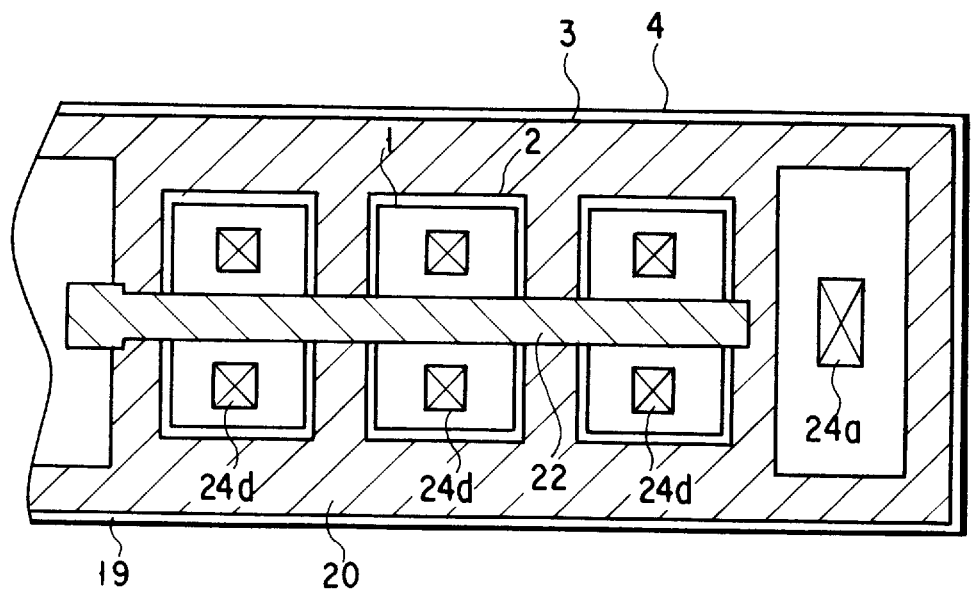
F I G. 9

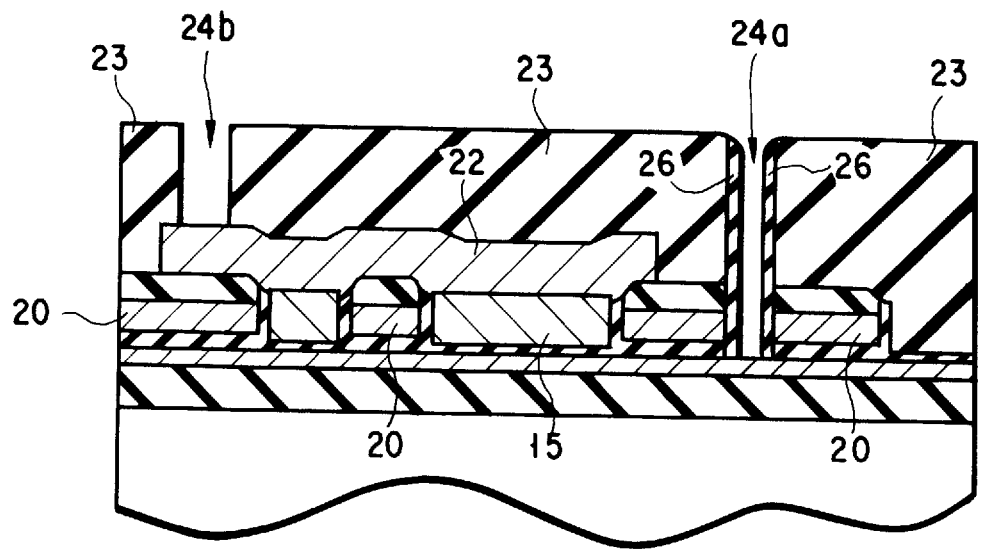
F I G. 11G
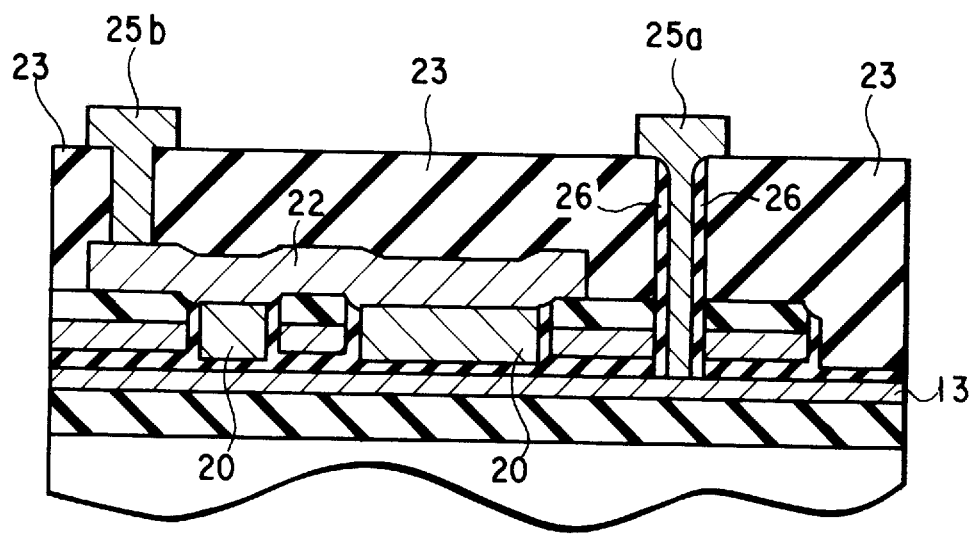
F I G. 11H

SEMICONDUCTOR DEVICE AND METHOD OF MANUFACTURING THE SAME

BACKGROUND OF THE INVENTION

The present invention relates to a semiconductor device such as SOI (Silicon on Insulator)—MOSFET and a method of manufacturing the same.

A SOI-MOSFET, which is operable at high speed under a low voltage, exhibits a high driving performance, has a small parasitic capacitance, and is free from soft errors, attracts attentions in this technical field as being highly hopeful in future.

However, the SOI device exhibits a so-called "floating body effect", i.e., the effect produced by the condition that the SOI body is put under an electrically floating state, such as deterioration of the drain breakdown voltage or generation of kink in the static characteristics. In order to put the SOI device into practical use, it is highly important to solve the problem of the floating body effect.

Various measures are being proposed for eliminating the floating body effect. For example, it is proposed to allow the channel region to extend to a region outside the gate region so as to permit the channel region (SOI Body) to be electrically connected to the electrode for body contact. Also proposed is a BTS (Body-Tied-to-Source) structure in which the body is tied to the source. However, the former measure makes the pattern design complex and leads to increases in the element area and gate capacitance. On the other hand, the latter measure causes the source and drain to cease to be interchangeable and brings about reduction in the channel width, leading to a decreased drain current.

Further proposed is an FS (Field Shield) isolation technology, which is said to be capable of solving the above-noted problems and of suppressing the floating body effect.

FIG. 1A is a plan view exemplifying the construction of a conventional device utilizing the FS isolation technology, with FIG. 1B showing a cross section along line 1B—1B shown in FIG. 1A. A reference numeral 51 shown in the drawing denotes a silicon substrate. It is shown that a buried oxide (BOX) layer 52 and a SOI layer 53 are formed on the silicon substrate 51. A SOI substrate consists of these silicon substrate 51, BOX layer 52 and SOI layer 53. Formed on the SOI substrate are a LOCOS isolation layer 54, an FS gate 55 and a transfer gate electrode 56. It should be noted that an electrode 58 for a body contact is connected to the SOI layer 53 through an opening 57a. Also, an electrode (not shown) for contact with the FS gate 55 is connected to the FS gate 55 through an opening 57b. Further, electrodes (not shown) for contact with source and drain regions are connected to the source and drain regions through openings 57c.

The FS isolation technology outlined above makes it possible to achieve a construction which permits the holes accumulated within the channel region, said holes causing the floating gate effect, to flow through a region below the FS gate into the body contact. It is also possible to suppress an increase in the element area, if a well contact region employed in an LSI device having the ordinary bulk silicon substrate is used in the body contact region in the SOI device.

However, the FS isolation technology gives rise to serious problems. First of all, a stepped portion corresponding to the thickness of the FS electrode causes the gate electrode formed on the FS gate to have an irregular surface, making it difficult to process the gate electrode. Also, where the FS gate is present over the entire isolation region and an upper wiring is formed on the isolation region, the capacitive coupling between the upper wiring and the FS gate is increased so as to give a detrimental effect to the operating speed of the device. Further, where a LOCOS isolation or a trench isolation is employed in combination with the FS isolation for decreasing the capacitive coupling, the number of manufacturing steps is markedly increased.

BRIEF SUMMARY OF THE INVENTION

An object of the present invention is to provide a semiconductor device which permits a gate electrode formed above an FS electrode to have a flat surface.

Another object of the present invention is to provide a method of manufacturing a semiconductor device, the method permitting a gate electrode formed above an FS electrode to have a flat surface.

Another object is to provide a semiconductor device which permits decreasing a capacitive coupling between an FS electrode and an upper electrode in an isolation region.

Another object is to provide a method of manufacturing a semiconductor device, the method making it possible to decrease a capacitive coupling between an FS electrode and an upper electrode in an isolation region.

Further, still another object of the present invention is to provide a method of manufacturing a semiconductor device, the method making it possible to form an isolation region with a smaller number of manufacturing steps.

According to a first aspect of the present invention, there is provided a semiconductor device, comprising a substrate having a first region and a second region surrounding the first region, a MOS transistor formed in the first region, a first conductive layer formed in the first region and constituting the lower layer of a two-layered gate electrode of the MOS transistor, a second conductive layer for isolation, the second conductive layer being formed in the second region and having an upper surface whose level is lower than that of the upper surface of the first conductive layer, a first insulating layer formed between the first and second regions, a second insulating layer formed on the second conductive layer, and a third conductive layer formed over the first conductive layer and the second insulating layer and constituting the upper layer of the two-layered gate electrode of the MOS transistor.

According to a second aspect of the present invention, there is provided a method of manufacturing a semiconductor device, comprising the steps of forming a first conductive layer on a substrate, selectively removing the first conductive layer so as to form the lower layer of a two-layered gate electrode of a MOS transistor in a first region of the substrate and to form a groove in a second region surrounding the first region, forming a first insulating layer on the inner surface of the groove, forming a second conductive layer for isolation in the groove, the upper surface level of the second conductive layer being lower than that of the lower layer of the two-layered gate electrode, forming a second insulating layer on the second conductive layer formed in the groove so as to fill the groove with the second insulating layer, and forming a third conductive layer over the lower layer of the two-layered gate electrode and the second insulating layer, the third conductive layer constituting the upper layer of the two-layered gate electrode of the MOS transistor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3A to 3L are cross sectional views collectively showing the manufacturing steps of the SOI-MOSFET shown in FIGS. 2A and 2B;

FIG. 4A is an oblique view showing a processed shape of a flattened gate electrode of a two-layer structure according to the present invention;

FIG. 5A is a plan view showing a SOI-MOSFET according to a second embodiment of the present invention;

FIG. 5B is a cross sectional view alone line 5B—5B shown in FIG. 5A;

FIG. 8 is a plan view showing a SOI-MOSFET according to a third embodiment of the present invention;

FIG. 9 is a plan view showing a SOI-MOSFET according to a fourth embodiment of the present invention;

FIGS. 11A to 11H are cross sectional views collectively showing the manufacturing steps of the SOI-MOSFET shown in FIGS. 10A and 10B.

DETAILED DESCRIPTION OF THE INVENTION

The semiconductor device of the present invention is featured in that a gate electrode formed across an FS electrode is of a two-layer structure consisting of a lower layer having an upper surface higher than the upper surface level of the FS electrode and an upper layer formed on the lower layer and extending over the FS electrode. The particular construction makes it possible to allow the gate electrode to have a flat upper surface, though the gate electrode extends across the FS electrode.

It should also be noted that a first portion having a small width and a second portion having a large width can be formed in a second region surrounding a first region having the lower layer of the gate electrode formed therein. Further, it is possible not to form the FS electrode in a central portion of the second portion having a large width. When the upper wiring is formed over the second region, the particular construction noted above permits decreasing the capacitive coupling between the upper wiring and the FS electrode. Further, where the region in which the FS electrode is not present is set large and, for example, an electrode for body contact is formed within the large region, insulation between the electrode for the body contact and the FS electrode can be achieved without fail.

In addition, the FS electrode and a second insulating film can be formed over the entire region of the narrow first portion of the second region. In this case, an electrode for contact can be brought into contact with the FS electrode without fail in forming the electrode for contact on the FS electrode.

Incidentally, since the FS electrode and the second insulating layer can be formed in the groove in the second region by self-alignment, the manufacturing process of the device can be simplified. Further, a LOCOS isolation or a trench isolation need not be employed in combination with the FS isolation for decreasing the capacitive coupling. This is also effective for simplifying the manufacturing process of the device.

Figure 2A:
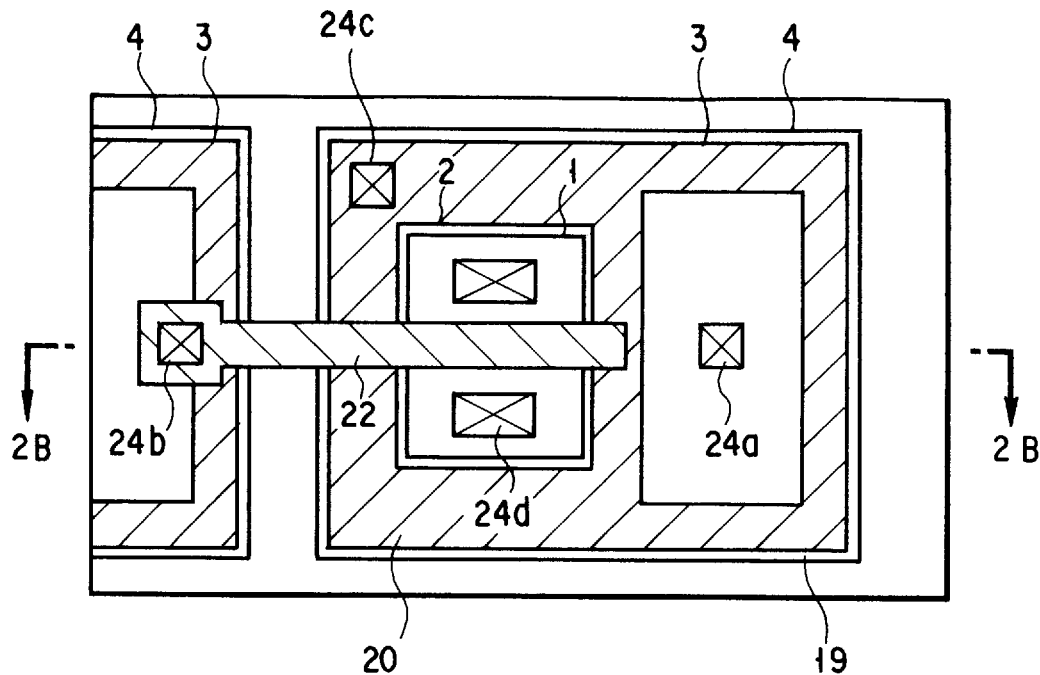
FIG. 2A is a plan view showing a SOI-MOSFET according to a first embodiment of the present invention.
Figure 2B:
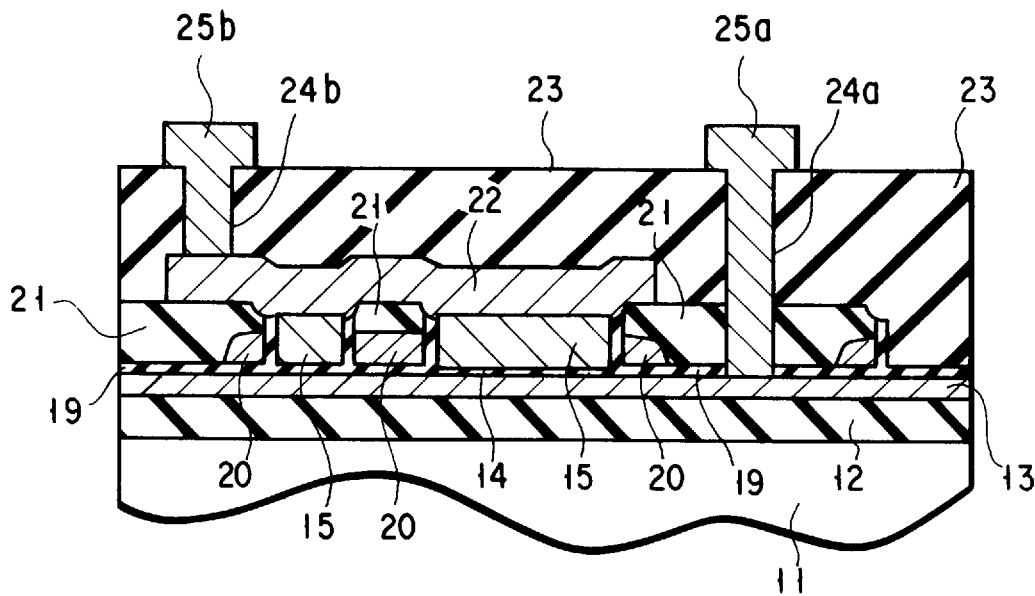
FIG. 2B is a cross sectional view alone line 2B—2B shown in FIG. 2A.

Let us describe various embodiments of the present invention with reference to the accompanying drawings. First of all, FIGS. 2A and 2B are a plan view and a cross sectional view, respectively, showing a SOI-MOSFET according to a first embodiment of the present invention, FIG. 2B showing the cross section along line 2B—2B shown in FIG. 2A.

In this embodiment, a SOI substrate, which consists of a silicon substrate 11, a buried oxide (BOX) layer 12 and a SOI (silicon on insulator) layer 13, is prepared by a SIMOX (separation by implanted oxygen) technology. To be more specific, the BOX layer 12 and the SOI layer 13 are formed on the silicon substrate 11 by implanting oxygen ions into the silicon substrate. A gate oxide film 14 is selectively formed on the SOI substrate. Also, a conductive layer 15 (first conductive layer) is formed on the gate oxide layer 14. Further, an insulating layer 19 (first insulating layer) is formed to cover that surface of the SOI layer 13 on which the gate oxide layer 14 is not formed and to cover the side wall of the conductive layer 15. It should be noted that the substrate surface is partitioned by the insulating layer 19 formed to cover the side wall of the conductive layer 15 into a first region inside a solid line 1, a second region between solid lines 2 and 3, and a third region outside a solid line 4. The conductive layer 15 (first conductive layer) is formed to cover a portion of the first region and a portion of the third region. It should be noted that the conductive layer 15 within the first region constitutes a lower layer of a gate electrode having a two-layer structure.

A conductive layer 20 (second conductive layer) constituting an FS (Field Shield) electrode is formed in the second region. The level of the upper surface of the conductive layer 20 is lower than that of the upper surface of the conductive layer 15. The second region includes a broad portion and a narrow portion. The conductive layer 20 is selectively formed along the insulating layer 19 formed to cover the side surface of the conductive layer 15. In other words, a conductive layer is not formed in a central portion of the broad portion. On the other hand, the conductive layer 20 is formed to cover the entire region of the narrow portion. Since a region where a conductive layer is not present is included in a central portion of the broad portion, it is possible to decrease a capacitive coupling between an upper wiring (not shown) formed on an insulating layer 23 and the FS electrode (conductive layer 20).

An insulating layer 21 (second insulating layer) is formed to cover both the conductive layer 20 and the insulating layer 19 in a manner to form a region corresponding to the second region. FIG. 2B shows that the upper surface of the insulating layer 21 is somewhat higher than the upper surface of the conductive layer 15. It should be noted that the difference in the upper surface level between the insulating layer 21 and the conductive layer 15 should desirably be as small as possible in order to diminish the stepping between the two.

A conductive layer 22 (third conductive layer), which constitutes an upper layer of the gate electrode of a two-layer structure, is formed to cover the conductive layer 15 and the insulating layer 21 such that the conductive layer 22 extends over the first, second and third regions. Since the stepping between the insulating layer 21 and the conductive layer 15 is small, as already pointed out, the conductive layer 22 formed on these layers 21 and 15 has an upper surface excellent in flatness.

The insulating layer 23 referred to previously is formed on the entire surfaces of the first, second and third regions. Openings 24a, 24b, 24c and 24d are formed in the insulating layer 23. A conductive layer 25a for body contact, i.e., contact with the SOI layer 13, is formed to fill the opening 24a. A conductive layer 25b for contact with the gate electrode (conductive layer 22) is formed to fill the opening 24b. A conductive layer (not shown) for contact with the FS electrode (conductive layer 20) is formed to fill the opening 24c. Further, electrodes (not shown) for contact with the source and drain regions are formed to fill the openings 24d.

Figure 3J:
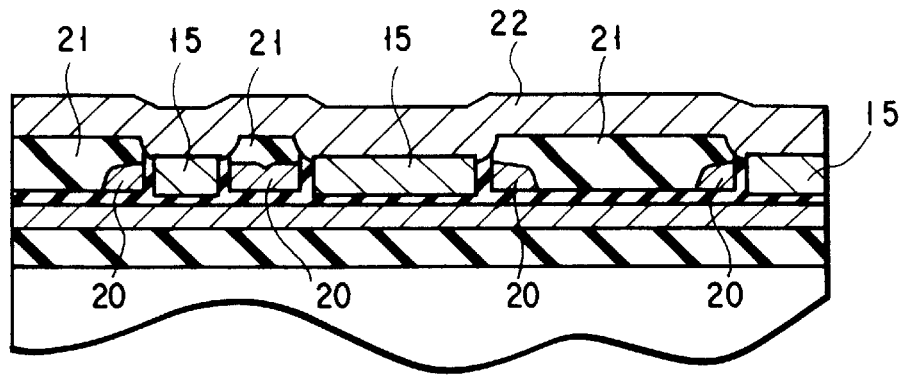

FIGS. 3A to 3L collectively show how to manufacture the SOI-MOSFET structure shown in FIGS. 2A and 2B. In the first step, a BOX layer 12 having a thickness of at most 100 nm and a SOI layer 13 having a thickness of at most 100 nm are formed on the surface of a silicon substrate 11, as shown in FIG. 3A. A channel ion implantation is applied, if necessary, to the SOI layer 13 for controlling the threshold voltage of the MOS transistor. In the next step, a gate oxide film 14 is formed in a thickness of about 6 nm by oxidizing the surface of the SOI layer 13, as shown in FIG. 3B, followed by forming a conductive layer 15 on the gate oxide film 14 by depositing a polycrystalline silicon layer in a thickness of about 150 nm. Further, impurity ions are implanted into each of an NMOS region and a PMOS region of the conductive layer 15 at a dose of about $5\times10^{15}$ cm$^{-2}$, followed by applying an annealing treatment at 800° C. for about 30 minutes so as to activate the implanted ions. After the annealing treatment, a silicon oxide layer 16 is formed in a thickness of about 10 nm by oxidizing the surface of the conductive layer 15, followed by forming a silicon nitride layer 17 in a thickness of about 100 nm on the oxide layer 16.

Then, the silicon nitride layer 17 is coated with resist to form a resist layer, as shown in FIG. 3C. The resultant resist layer is patterned by lithography or EB delineation so as to form resist patterns 18a and 18b. The region having the resist pattern 18a formed therein corresponds substantially to the first region, with the region having the resist pattern 18b formed therein corresponding substantially to the third region. Further, the region free from any of the resist patterns 18a and 18b substantially corresponds to the second region (isolation region). The resist patterns 18a and 18b are used in the next step as masks so as to selectively remove the silicon nitride layer 17, the silicon oxide layer 16, and the polycrystalline silicon layer (conductive layer 15) by means of an anisotropic etching such as RIE. As a result, a groove is formed in a manner to surround a laminate structure consisting of the silicon nitride layer 17, the silicon oxide layer 16 and the conductive layer 15.

Further, the resist patterns 18a and 18b are removed, following by implanting ions into the isolation region to form a channel stopper. In this ion implantation step, the laminate structure consisting of the silicon nitride layer 17, the silicon oxide layer 16 and the conductive layer 15 is used as a mask. Since the conductive layer 15, etc. can be used as a mask, the present invention permits decreasing the number of manufacturing steps. After the ion implantation step, the upper surface of the SOI layer 13 and the side surface of the conductive layer 15 are oxidized to form a silicon oxide layer 19 (first insulating layer) in a thickness of about 15 nm, as shown in FIG. 3D.

In the next step, the conductive layer 20 (second conductive layer) is formed in a thickness of about 250 nm on the entire surface by depositing polycrystalline silicon. It should be noted that the groove having the silicon oxide film formed on the inner surface thereof is filled with the conductive layer 20. Then, the conductive layer 20 is doped with impurity ions, followed by annealing the doped impurity so as to activate the impurity.

Further, the polycrystalline silicon layer (conductive layer 20) is etched back by RIE to form an FS electrode consisting of the conductive layer 20 within the groove, as shown in FIG. 3F. It is important to perform the etching back such that the upper surface of the conductive layer 20 is positioned lower than that of the conductive layer 15. In the broad isolation region, i.e., region having a large groove width (width of the second region), the conductive layer 20 is left unremoved only in the vicinity of the edge portion of the isolation region. In other words, the conductive layer 20 is completely removed from the central portion of the isolation region. On the other hand, the conductive layer 20 is left unremoved in the entire isolation region having a small width, i.e., the region having a small groove width (width of the second region). Incidentally, the term "broad isolation region" noted above denotes a region whose width is at least twice the thickness of the conductive layer 20. Likewise, the term "narrow isolation region" denotes a region whose width is smaller than twice the thickness of the conductive layer 20. In the actual manufacture of a semiconductor device, it is desirable to set the width of the broad isolation region at a value sufficiently larger than twice the thickness of the conductive layer 20. Likewise, it is desirable to set the width of the narrow isolation region at a value sufficiently smaller than twice the thickness of the conductive layer 20.

After formation of the FS electrode 20, a TEOS silicon oxide layer 21 (second insulating layer) is deposited on the entire surface in a thickness of about 400 nm by means of LPCVD, as shown in FIG. 3G. Further, the silicon oxide layer 21 is polished by a CMP method for the flattening purpose, as shown in FIG. 3H. In this polishing step, the silicon nitride layer 17 acts as a stopper of CMP. As already pointed out, the FS electrode (conductive layer 20) is not present in the central portion of the broad isolation region. In addition, the insulating layer 21 is buried in the isolation region by self-alignment. It follows that the manufacturing process can be simplified. In addition, the capacitive coupling between the upper wiring above the isolation region and the FS electrode can be decreased. Further, if the region where the FS electrode (conductive layer 20) is not present is set broader, formation of an electrode for body contact, which is carried out by RIE in a subsequent step, can be achieved easily.

In the next step, the silicon nitride layer 17 is removed by CDE, followed by removing the silicon oxide layer 16 by means of wet etching using, for example, an HF solution, so as to expose the surface of the conductive layer 15, as shown in FIG. 3I. The drawing shows that the upper surface of the conductive layer 15 is positioned somewhat lower than that of the insulating layer 21. It should be noted in this connection that the difference in the surface level between the insulating layer 21 and the conductive layer 15 should desirably be as small as possible in order to diminish the stepping as much as possible.

Further, a conductive layer 22 (third conductive layer) consisting of polycrystalline silicon or tungsten silicide (WSi) is formed on the entire surface by means of deposition or sputtering, as shown in FIG. 3J. In the case of using polycrystalline silicon, the polycrystalline silicon layer should be doped with an impurity. Incidentally, the conductive layer 22 may be of a laminate structure consisting of a TiN layer about 20 nm thick and a W layer about 100 nm thick. It is possible to make the upper surface of the insulating layer 21 substantially flush with the upper surface of the conductive layer 15. In this case, the silicon oxide layer 21 should be over-etched for making the upper surface thereof substantially flush with the upper surface of the conductive layer 15.

Figure 3K:
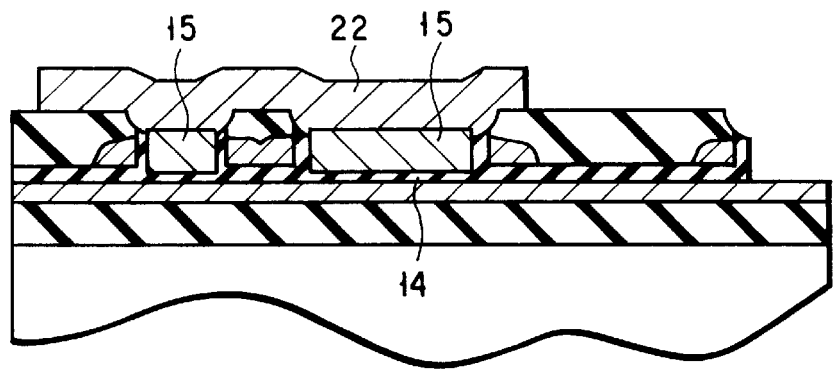

In the next step, the conductive layers 22 and 15 are patterned in the same step to form a gate electrode of a two-layer structure, as shown in FIG. 3K. In this step, lithography or RIE can be performed easily because a good flatness is obtained in the preceding steps described above. Also, the conductive layer 22 constituting the upper layer of the two-layer structure of the gate electrode is rendered excellent in flatness. After the etching step, the thin silicon oxide layer 14 alone is left unremoved on the surface of the source and drain regions in the first region.

Figure 3L:
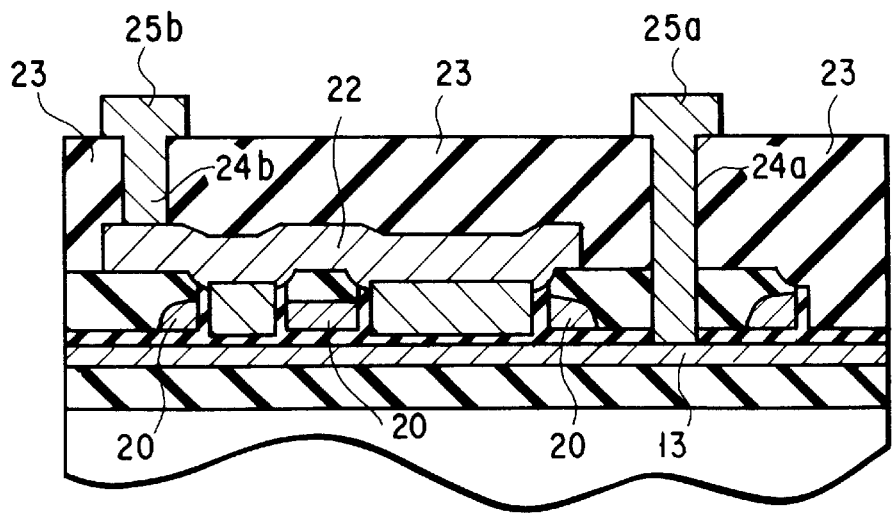

The subsequent steps are carried out in accordance with a general method of manufacturing an LSI. Specifically, ions of an n- or p-type impurity such as As or $BF_2$ are implanted into the source and drain regions at a dose of about $5 \times 10^{15}$ $cm^{-2}$. Then, a TEOS silicon oxide is deposited in a thickness of about 300 nm to form an interlayer insulating film 23, followed by forming openings 24a, 24b, 24c(not shown), and 24d (not shown) in the insulating film 23, as shown in FIG. 3L. Further, a conductive layer consisting of, for example, aluminum, is deposited on the entire surface, followed by patterning the resultant conductive layer so as to form in these openings a conductive layer 25a for body contact (contact with the SOI layer 13), a conductive layer 25b for contact with the gate electrode (conductive layer 22), a conductive layer (not shown) for contact with the FS electrode (conductive layer 20), and an electrode (not shown) for contact with the source and drain regions. As a result, formed is a SOI-MOSFET as shown in FIGS. 2A and 2B, which is free from the floating body effect.

Figure 4B:
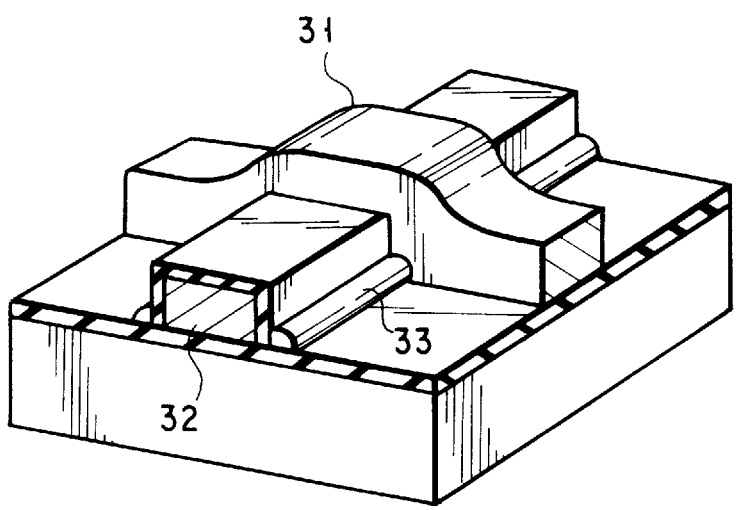
FIG. 4B is an oblique view showing a processed shape of a conventional gate electrode of a single layer structure.

FIG. 4A shows the worked state of the gate electrode formed in the present invention, said electrode being of a two-layer structure consisting of a lower layer 31a and an upper layer 31b, with FIG. 4B showing the worked state of a conventional gate electrode of a single layer structure. In general, a wiring material layer is formed on an underlayer formed in advance and having a stepped portion, with the result that the formed wiring material layer has a larger thickness in the stepped portion. It follows that, where the gate electrode 31 of a single layer structure is worked by RIE, the gate material layer is left unremoved after the RIE treatment to form an etching residue 33 in a lower portion of the side wall of the FS electrode 32, as shown in FIG. 4B. In the present invention, however, the lower layer 31a of the gate electrode 31 is formed flat, as shown in FIG. 4A. As a result, the gate electrode 31 is not particularly thickened in the stepped portion. It follows that, where the upper layer 31b and the lower layer 31a of the gate electrode 31 are simultaneously patterned by RIE, an etching residue is unlikely to remain in a lower portion of the side wall of the FS electrode 32, making it possible to work the gate electrode easily.

Figures 6A, 6B:
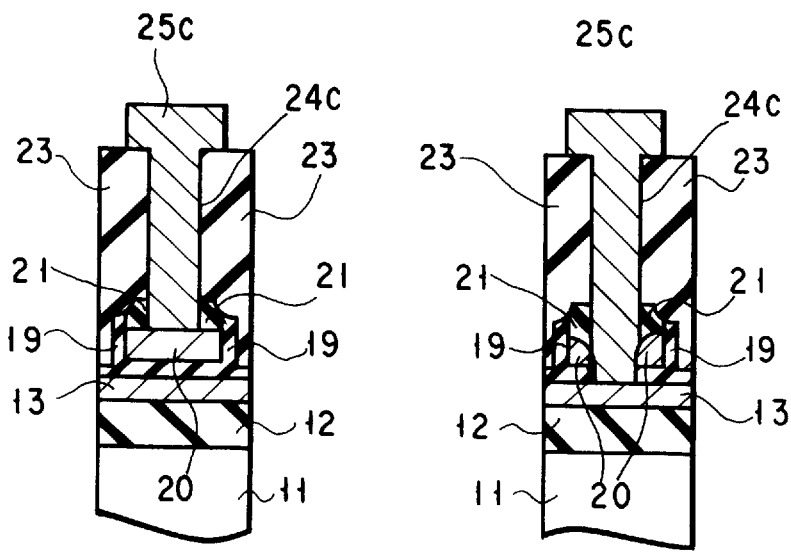
FIGS. 6A and 6B are cross sectional views along line 6—6 shown in FIG. 5A.
Figures 7A, 7B:
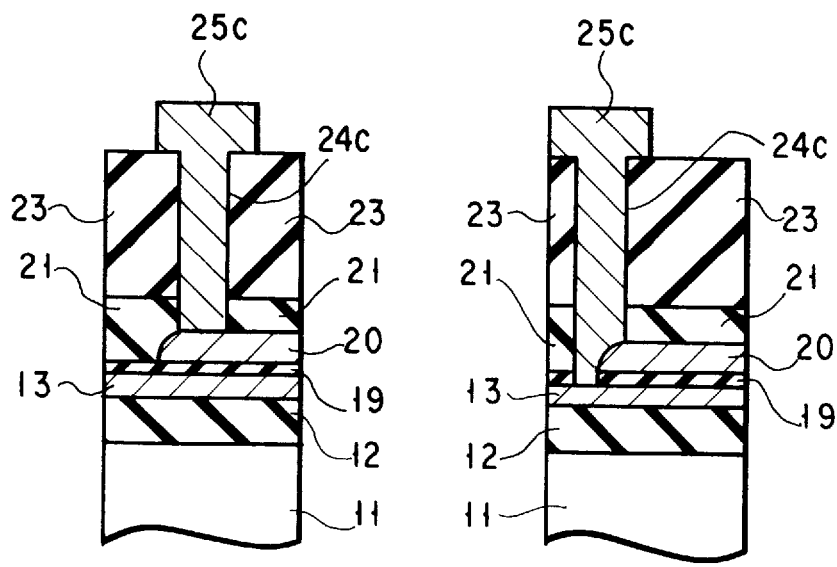
FIGS. 7A and 7B are cross sectional views along line 7—17 shown in FIG. 5A.

FIGS. 5A to 7B collectively show a SOI-MOSFET according to a second embodiment of the present invention. Specifically, FIG. 5A is a plan view showing the SOI-MOSFET of the present invention. FIG. 5B is a cross sectional view along line 5B—5B shown in FIG. 5A. FIGS. 6A and 6B are cross sectional views along line 6—6 shown in FIG. 5A. Further, FIGS. 7A and 7B are cross sectional views along line 7—7 shown in FIG. 5A. The second embodiment is substantially equal in basic construction and manufacturing method to the first embodiment described previously. Therefore, the same reference numerals are put to the corresponding constituents of the device, and description thereof including the manufacturing steps is omitted in the following description of the second embodiment.

In the SOI-MOSFET of the first embodiment, the conductive layer 22 constituting the upper layer of the gate electrode is positioned over the first, second and third regions, as shown in FIG. 2B. In the SOI-MOSFET of the second embodiment, however, the conductive layer 22 noted above is positioned over the first and second regions alone, failing to reach the third region.

When the FS electrode is formed by using RIE in the first embodiment as shown in FIG. 3F, the conductive layer 20 is left unremoved in the entire region of the narrow isolation region, i.e., region having a small groove width (width of the second region), as already described in conjunction with the first embodiment. Therefore, if the opening 24c is formed in the insulating layer 23 in the narrow isolation region, the conductive layer 20 is exposed to the entire bottom region of the opening 24c, making it possible to ensure the contact between the electrode for contact (conductive layer 25c) and the FS electrode (conductive layer 20). In this case, the relationship between the groove width W and the thickness t of the conductive layer 20 should meet the condition $2t \geq W$. Where the groove width W is unduly large or the thickness t of the conductive layer 20 is unduly small so as to cause the relationship $2t \geq W$ not to be satisfied, the conductive layer 20 fails to cover the entire bottom region of the opening 24c, leading to an insufficient contact between the electrode for contact (conductive layer 25c) and the FS electrode (conductive layer 20), as shown in FIG. 6B. Further, short-circuiting is brought about between the SOI layer 13 and the conductive layer 20.

Further, where the position of the opening 24c is apart to some extent from the region where the FS electrode (conductive layer 20) is not formed, the conductive layer 20 is exposed to the entire bottom region of the opening 24c, as shown in FIG. 7A. However, where the position of the opening 24c is unduly close to the region where the FS electrode (conductive layer 20) is not formed, a difficulty as shown in FIG. 7B is brought about by, for example, deviation of the opening 24c, with the result that a short-circuiting is likely to be caused between the FS electrode (conductive layer 20) and the SOI layer 13. Naturally, it is desirable to form the opening 24c somewhat apart from the region where the FS electrode is not formed. For example, it is desirable to form the opening 24c in the insulating layer 23 in a region between solid lines 1 and 3.

FIGS. 8 and 9 are plan views showing SOI-MOSFETs according to third and fourth embodiments, respectively, of the present invention. These embodiments are substantially equal in basic construction and manufacturing methods thereof to the first and second embodiments described previously. Therefore, the same reference numerals are put to the corresponding constituents, and description thereof including the manufacturing steps is omitted in the following description of the third and fourth embodiments.

In the first and second embodiments, a single transistor is provided with a single body contact. In each of the third and fourth embodiments, however, a single body contact, i.e., opening 24a, is formed for common use in a plurality of transistors. The particular construction permits decreasing the area occupied by the device.

Figure 10A:
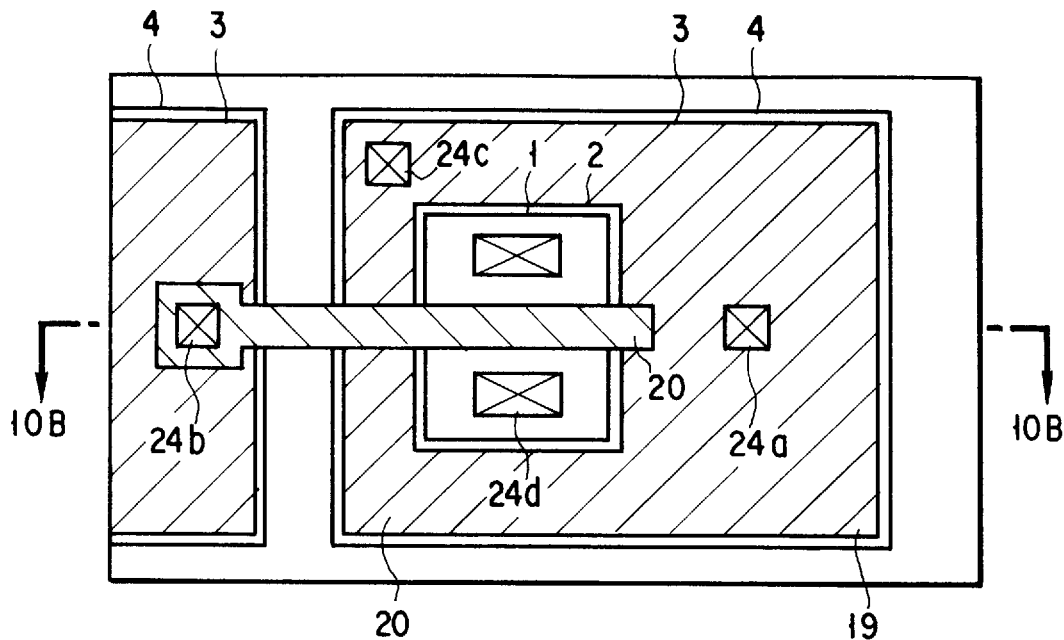
FIG. 10A is a plan view showing a SOI-MOSFET according to a fifth embodiment of the present invention.
Figure 10B:
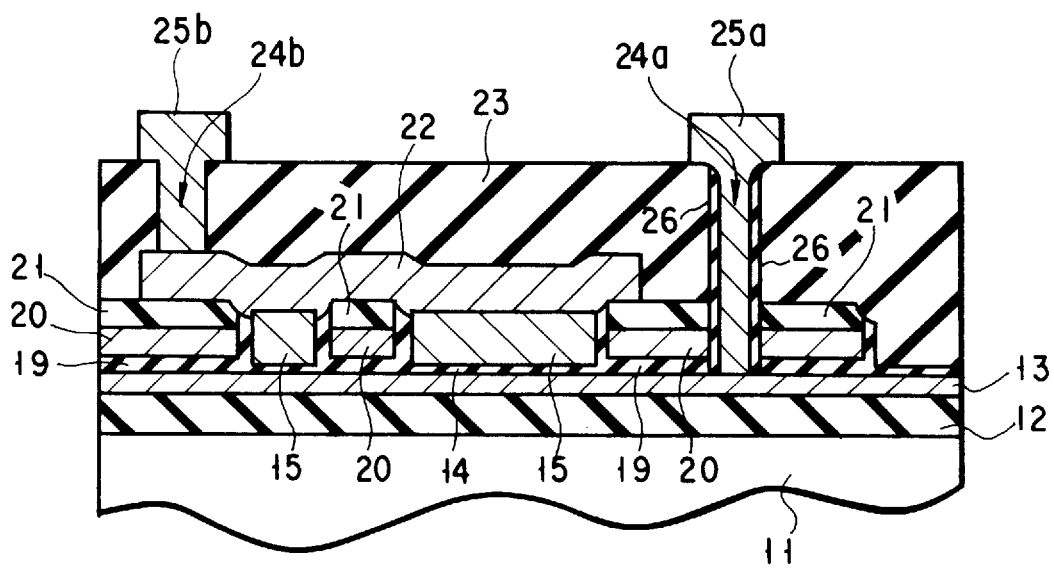
FIG. 10B is a cross sectional view along line 10B—10B shown in FIG. 10A.

FIG. 10A is a plan view showing a SOI-MOSFET according to a fifth embodiment of the present invention, with FIG. 10B showing a cross section along line 10B—10B shown in FIG. 10A. The fifth embodiment is substantially equal in basic construction to the first embodiment described previously. Therefore, the same reference numerals are put to the corresponding constituents of the device so as to omit the overlapping description.

In the first embodiment, the second region includes broad and narrow regions. As shown in FIG. 2A, the broad region includes a central portion where a conductive layer is not formed; whereas, the conductive layer 20 is formed to cover the entire narrow region. In the fifth embodiment, however, the conductive layer 20 is formed to cover the entire second region including the broad and narrow portions.

Figure 11A:
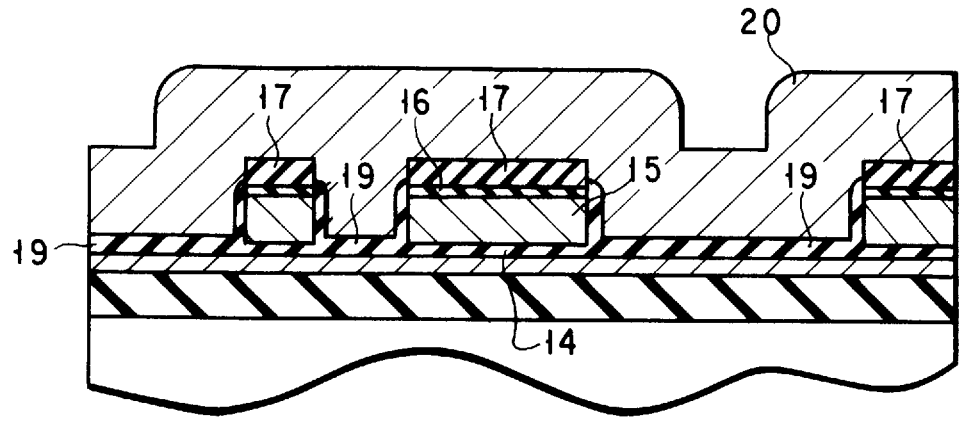
Figure 11B:
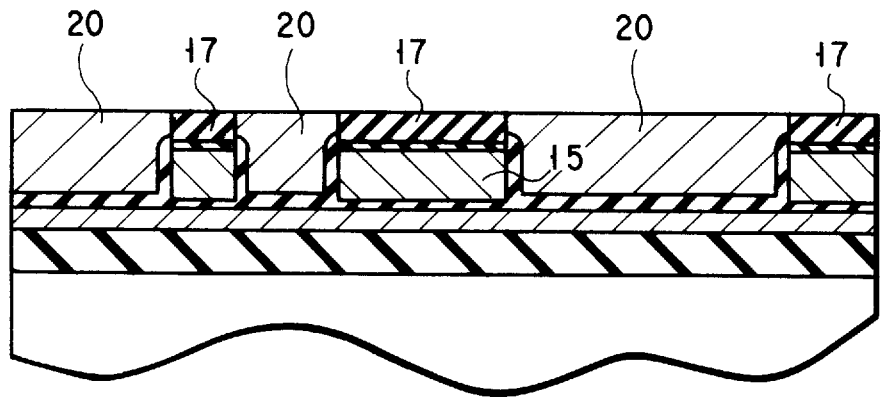

FIGS. 11A to 11H collectively show how to manufacture the device constructed as shown in FIGS. 10A and 10B. It should be noted that the structure shown in FIG. 11A is equal to that shown in FIG. 3E. Of course, the manufacturing steps required for preparing the structure shown in FIG. 11A are equal to those described previously in conjunction with the first embodiment with reference to FIGS. 3A to 3D. In the next step, the upper portion of the conductive layer 20 is removed by CMP (chemical mechanical polishing) method so as to cause the conductive layer 20 to remain only within grooves (isolation regions), as shown in FIG. 11B. In this step, the silicon nitride layer 17 acts as a stopper of the CMP treatment.

Figure 1A:
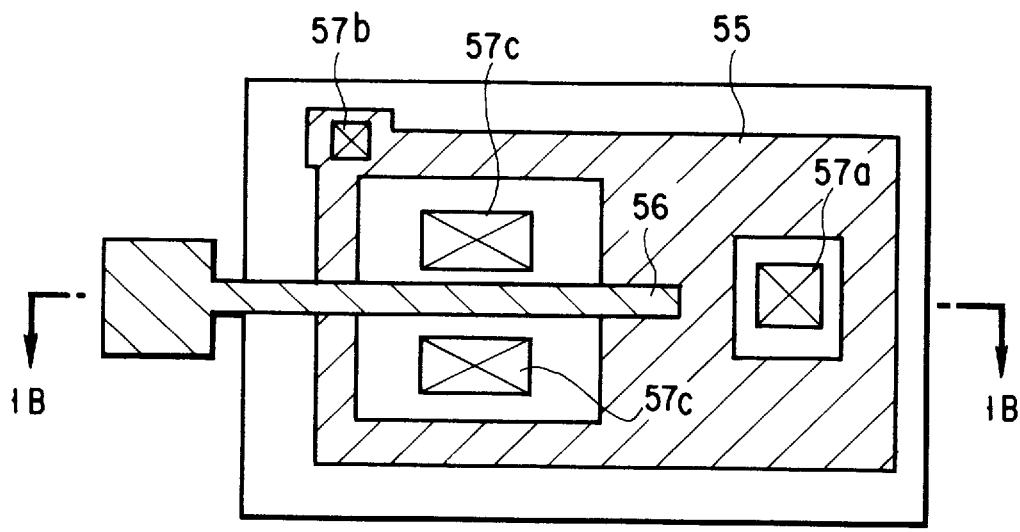
FIG. 1A is a plan view showing a conventional SOI-MOSFET.
Figure 1B:
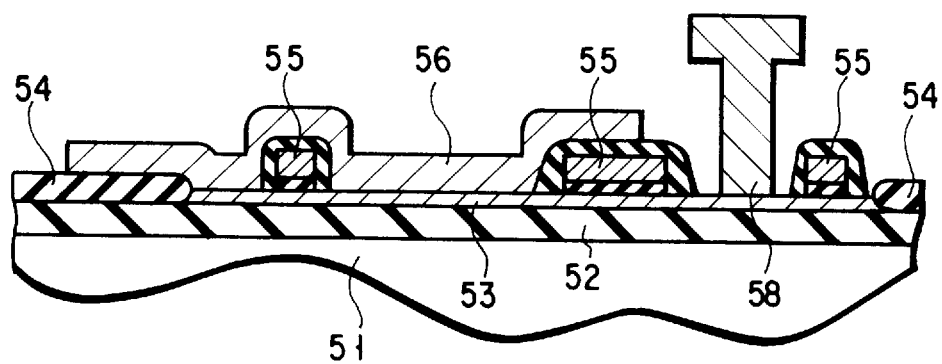
FIG. 1B is a cross sectional view along line 1B—1B shown in FIG. 1A.
Figure 11C:
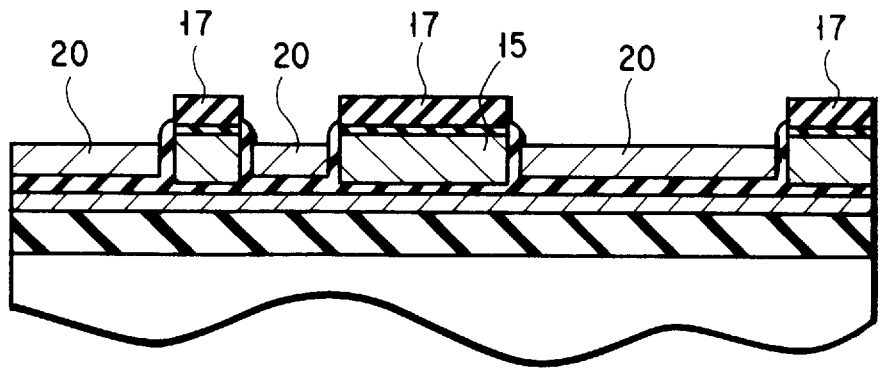
Figure 11D:
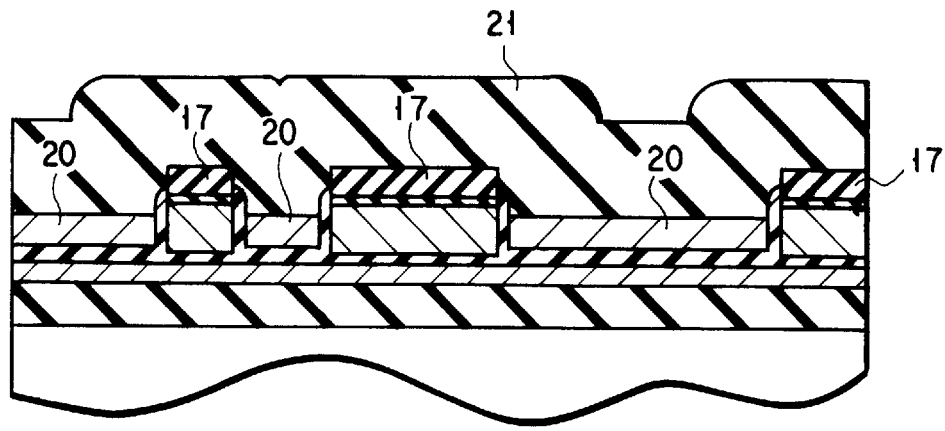
Figure 11E:
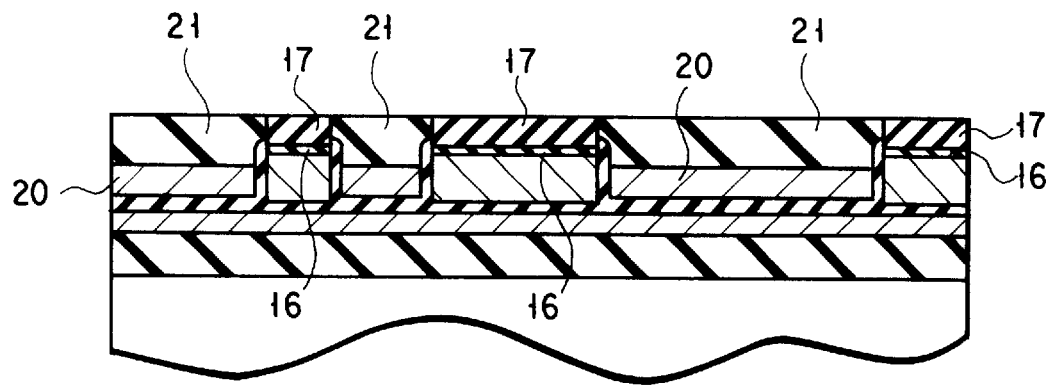

Then, the conductive layer 20 is further etched by RIE such that the conductive layer 20 is left unremoved in a lower portion of the groove in a thickness of about 70 nm so as to form an FS electrode, as shown in FIG. 11C. In this etching step, the upper surface of the remaining conductive layer 20 should be made lower than that of the conductive layer 15. After the etching step, a TEOS silicon oxide layer 21 (second insulating layer) is deposited in a thickness of about 400 nm on the entire surface by a LPCVD method, as shown in FIG. 11D, followed by polishing the silicon oxide layer 21 by a CMP method so as to flatten the layer 21, as shown in FIG. 1E. In this polishing step, the silicon nitride layer 17 acts as a stopper of the CMP treatment. This embodiment differs from the first embodiment in that the FS electrode (conductive layer 20) is formed over the entire region of the groove (isolation region). However, if the silicon oxide layer 21 buried in the groove is formed to have a reasonable thickness, the capacitive coupling between an upper wiring layer and the FS electrode can be suppressed to some extent.

Figure 11F:
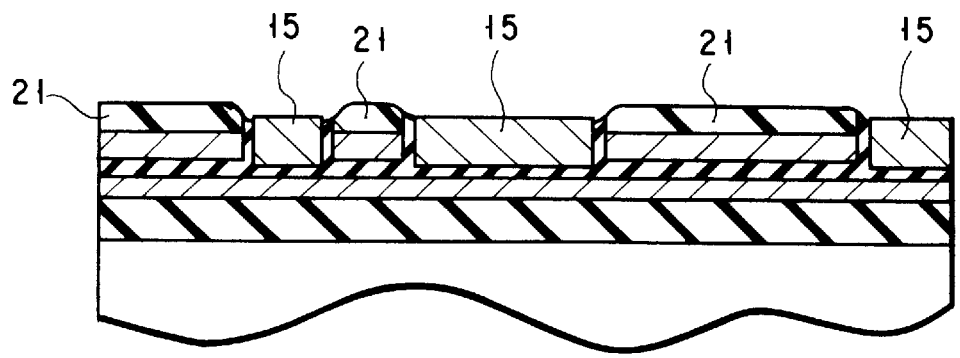

In the next step, the silicon nitride layer 17 is removed by CDE (chemical dry etching), followed by further removing the silicon oxide layer 16 by means of a wet etching using an HF series etchant so as to expose the surface of the conductive layer 15, as shown in FIG. 11F. The drawing shows that the upper surface of the conductive layer 15 is somewhat lower than that of the insulating layer 21. It should be noted that the difference in the surface level between the insulating layer 21 and the conductive layer 15 should desirably be as small as possible so as to diminish the stepping as much as possible.

Further, the conductive layer 22 (third conductive layer) consisting of polycrystalline silicon or tungsten silicide (WSi) is formed over the entire surface by means of deposition or sputtering. In the case of using polycrystalline silicon, the conductive layer 22 is doped with an impurity. Also, the conductive layer 22 may be of a laminate structure consisting of a TiN layer about 20 nm thick and a W layer about 100 nm thick. Then, the conductive layers 22 and 15 are etched in the same step to form a gate electrode of a two-layer structure. In this case, lithography or RIE can be performed easily because a good flatness is obtained in the preceding steps. Also, the conductive layer 22 constituting the upper layer of the gate electrode of the two-layer structure has an excellent flatness.

The subsequent steps required for preparing the structure shown in FIG. 11G are performed in accordance with a general method of manufacturing an LSI. Specifically, an n- or p-type impurity such as As or $BF_2$ is introduced by ion implantation into source and drain regions at a dose of about $5 \times 10^{15}$ cm$^{-3}$, followed by forming an interlayer insulating film 23 in a thickness of about 300 nm by depositing a TEOS silicon oxide. Then, an opening 24a is formed in the insulating film 23 by means of lithography and RIE, followed by forming a silicon nitride layer 26 in a thickness of about 30 nm to cover the side wall of the opening 24a. The silicon nitride layer 26 is formed by means of deposition and RIE so as to prevent short-circuiting between an electrode formed later in the opening 24a and the FS electrode (conductive layer 20). After formation of the silicon nitride layer 26, three openings including an opening 24b are formed in the insulating film 23 by means of lithography and RIE so as to prepare the structure shown in FIG. 11G.

Finally, a conductive layer such as an aluminum layer is deposited on the entire surface, followed by patterning the conductive layer so as to form in the openings made in the insulating film 23 a conductive layer 25a for body contact (contact with the SOI layer 13), a conductive layer 25b for contact with the gate electrode (conductive layer 22), a conductive layer (not shown) for contact with the FS electrode (conductive layer 22), and an electrode (not shown) for contact with the source-drain region, as shown in FIG. 11H, thereby obtaining the SOI-MOSFET shown in FIGS. 10A and 10B, said MOSFET being free from the floating body effect.

The technical scope of the present invention is not limited to the embodiments described above. In other words, various modifications can be achieved within the technical scope of the present invention. For example, an insulating layer may be buried in place of the conductive layer formed in the third region.

As described above, the present invention permits flattening the gate electrode formed over the stepping caused by an FS electrode. Also, it is possible to suppress the capacitive coupling in the isolation region between the FS electrode and an upper wiring. Further, the method of the present invention makes it possible to decrease the number of process steps required for forming the isolation region.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A semiconductor device, comprising:
   a substrate having a first region and a second region surrounding said first region;
   a MOS transistor formed in the first region;
   a first conductive layer formed in the first region and constituting the lower layer of a two-layered gate electrode of said MOS transistor;
   a second conductive layer for isolation, said second conductive layer being formed in said second region and having an upper surface whose level is lower than that of the upper surface of the first conductive layer;
   a first insulating layer formed between the first and second regions;
   a second insulating layer formed on the second conductive layer; and
   a third conductive layer formed over the first conductive layer and the second insulating layer and constituting the upper layer of the two-layered gate electrode of the MOS transistor.

2. The semiconductor device according to claim 1, wherein said substrate is a silicon-on-insulator substrate.

3. The semiconductor device according to claim 1, wherein said second region includes a first portion and a second portion broader than said first portion, and a region where said second conductive layer is not formed is included in said second portion.

4. The semiconductor device according to claim 3, wherein the second conductive layer is formed over an entire width region of the first portion included in the second region.

5. The semiconductor device according to claim 1, wherein at least one fourth conductive layer connected to the substrate is formed in a region where the second conductive layer is not formed, said region being included in the second portion of the second region.

6. The semiconductor device according to claim 1, wherein said substrate has surround region positioned to surround the second region, and said third conductive layer extends to reach said third region.

7. The semiconductor device according to claim 4, wherein the width of the first portion included in the second region is smaller than twice a deposition thickness of the second conductive layer.

8. The semiconductor device according to claim 5, wherein a plurality of MOS transistors are formed in said first region, and the number of said at least one fourth conductive layer is one.

9. The semiconductor device according to claim 1, wherein said second region includes a first portion and a second portion broader than said first portion, and said second conductive layer is formed over an entire width of each of said first and second portions.

10. A method of manufacturing a semiconductor device, comprising the steps of:
    forming a first conductive layer on an insulating film formed on a semiconductor substrate;
    selectively removing said first conductive layer so as to form the lower layer of a two-layered gate electrode of a MOS transistor in a first region of the substrate;
    forming a groove in a second region surrounding said first region;
    forming a first insulating layer on the inner surface of said groove;
    forming a second conductive layer for isolation in the groove, the upper surface level of said second conductive layer being lower than that of the lower layer of said two-layered gate electrode;
    forming a second insulating layer on said second conductive layer formed in the groove so as to fill the groove with said second insulating layer; and
    forming a third conductive layer over the lower layer of the two-layered gate electrode and the second insulating layer, said third conductive layer constituting the upper layer of the two-layered gate electrode of said MOS transistor.

11. The method of manufacturing a semiconductor device according to claim 10, wherein said substrate is a silicon-on-insulator substrate.

12. The method of manufacturing a semiconductor device according to claim 10, wherein said second region includes a first portion and a second portion broader than said first portion, and a region where said second conductive layer is not formed is included in said second portion.

13. The method of manufacturing a semiconductor device according to claim 12, wherein the second conductive layer is formed over an entire width region of the first portion included in the second region.

14. The method of manufacturing a semiconductor device according to claim 12, further comprising the step of forming at least one fourth conductive layer connected to the substrate in the region where the second conductive layer is not formed, said region being included in the second portion of the second region.

15. The method of manufacturing a semiconductor device according to claim 10, wherein said substrate has a third region positioned to surround the second region, and said third conductive layer extends to reach said third region.

16. The method of manufacturing a semiconductor device according to claim 12, wherein a width of the groove in the first portion included in the second region is smaller than twice a deposition thickness of the second conductive layer.

17. The method of manufacturing a semiconductor device according to claim 12, wherein a plurality of MOS transistors are formed in said first region, and number of said at least one fourth conductive layer is one.

18. The method of manufacturing a semiconductor device according to claim 10, wherein said second region includes a first portion and a second portion broader than said first portion, and said second conductive layer is formed over the entire width of each of said first and second portions.

* * * * *